United States Patent
Ross et al.

(10) Patent No.: US 6,668,448 B2
(45) Date of Patent: Dec. 30, 2003

(54) METHOD OF ALIGNING FEATURES IN A MULTI-LAYER ELECTRICAL CONNECTIVE DEVICE

(75) Inventors: Benjamin B. Ross, Issaquah, WA (US); Phillip L. Jordan, Sultan, WA (US); Jeffery A. Strole, Ellensburg, WA (US)

(73) Assignee: MicroConnex Corp., Snoqualmie, WA (US)

( * ) Notice: Subject to any disclaimer, the term of this patent is extended or adjusted under 35 U.S.C. 154(b) by 142 days.

(21) Appl. No.: 09/909,021

(22) Filed: Jul. 19, 2001

(65) Prior Publication Data

US 2001/0039729 A1 Nov. 15, 2001

Related U.S. Application Data

(62) Division of application No. 09/310,873, filed on May 12, 1999, now Pat. No. 6,354,000.

(51) Int. Cl.⁷ ................................................ H05K 3/30
(52) U.S. Cl. .................. 29/837; 29/592.1; 29/729; 29/830; 29/846; 29/847; 174/255; 174/262; 174/263; 174/264
(58) Field of Search ............................. 29/592.1, 729, 29/830, 837, 846, 847, 852, 879; 174/255, 262, 263, 264; 361/321.2, 794; 438/123, 127, 612, 618

(56) References Cited

U.S. PATENT DOCUMENTS

| | | | |
|---|---|---|---|
| 3,904,934 A | * | 9/1975 | Martin .......................... 361/803 |
| 4,491,622 A | * | 1/1985 | Butt ............................. 428/632 |
| 4,642,160 A | * | 2/1987 | Burgess ......................... 216/18 |
| 4,698,275 A | * | 10/1987 | Holt ............................. 428/40.1 |
| 5,111,406 A | * | 5/1992 | Zachman et al. ............. 700/160 |
| 5,592,730 A | * | 1/1997 | Greenstein et al. ............ 29/594 |
| 5,718,367 A | * | 2/1998 | Covell et al. ................. 228/254 |
| 5,727,310 A | * | 3/1998 | Casson et al. ................. 29/830 |
| 5,855,049 A | * | 1/1999 | Corbett et al. .............. 29/25.35 |
| 6,085,415 A | * | 7/2000 | Gandhi et al. ................. 29/852 |
| 6,188,028 B1 | * | 2/2001 | Haba et al. .................. 174/266 |
| 6,236,572 B1 | * | 5/2001 | Teshome et al. ............. 361/794 |

* cited by examiner

*Primary Examiner*—Peter Vo
*Assistant Examiner*—Paul D. Kim
(74) *Attorney, Agent, or Firm*—Law Office of Timothy E. Siegel; Timothy E. Siegel

(57) ABSTRACT

A method of constructing an electric apparatus, comprising the following steps. First, a set of dielectric layers is provided. Next, a set of conductive features and at least one fiducial marking are formed on a first one of the dielectric layers, in mutual reference to each other so that their relative positions are known to a first tolerance. Then, a set of pin holes is formed in each dielectric layer, each pin hole formed in relation to the fiducial marking for its dielectric layer and all of the sets of pin holes having a mutually identical placement. Finally the dielectric layers are arranged onto a pin fixture having a set of pins that match the mutually identical placement of the pin holes.

6 Claims, 8 Drawing Sheets

METHOD OF ALIGNING FEATURES IN A MULTI-LAYER ELECTRICAL CONNECTIVE DEVICE

This is a division of application Ser. No. 09/310,873 filed May 12, 1999, now U.S. Pat. No. 6,354,000.

BACKGROUND OF THE INVENTION

The present invention relates to a method for making a planar array of independently connected electrical contact pads connected through multiple layers of conductive paths. There are many applications for this type of device. For example, such a device may be used to provide a rectilinear array of pads for testing of ball grid array (BGA) modules or circuit boards with BGA interconnect patterns that are too small to be tested by conventional pin probe testers. Another application is to provide for interconnection to a similarly patterned array of independently connectable electrical contact pads in an electrically stimulated array. The requirement that the electrical contact pads be independently connectable creates a conductive path routing and cross-talk suppression challenge.

One use for a planar array of independently connectable electrical contact pads is for electrical stimulation of, and electrical reception from, an ultrasound array. For a more complete description of the requirements for a connector to an ultrasound array, please see U.S. Pat. No. 5,855,049, issued Jan. 5, 1999, which is hereby incorporated by reference as if fully set forth herein. As noted in this reference, it is typical to use a flex circuit electrical contact pad array for the purpose of electrically connecting an ultrasound array to take advantage of the acoustical and mechanical characteristics of a flex circuit. A flex circuit has enough flexibility to permit a full set of connections without suffering the effects of the gaps that can be created by slight nonuniformities between two rigid surfaces. In addition, the flex circuit can be flexibly routed to connect the array to external circuit boards or cabling.

Another use for an array of independently connectable electrical contact pads is for attachment to the terminals of an integrated circuit (IC) die. IC dies are typically produced having a set of terminals along the periphery of the die and with the terminals mutually spaced apart by 50 to 100 microns. The die is typically placed in a package to form an outside interconnect pitch of 1.27 mm or smaller, for connection to a PCB. The IC die terminals are typically connected to an intermediate chip scale package circuit by means of wire bonding or by flip chip mounting to a flex circuit that expands outwardly from the die perimeter to a larger rectilinear array. The principle reason why the IC die terminals are arranged solely along the perimeter of the IC die is because of the limitations of wire bonding and flex circuit manufacturing technology. If a flex circuit having a partial or full rectilinear array of interconnect pads with a pitch on the order of tens of microns could be efficiently produced, this would permit IC dies to be produced having terminals in a matching array, thereby permitting more terminals into and out of the IC, a highly desirable goal.

Yet another application for planar array of independently connectable electrical contact pads, is in the testing of PCBs. It is highly desirable to test a PCB after production but prior to connecting circuitry to the PCB. If a flaw in the PCB is discovered after circuitry has been connected to the PCB, the entire circuit must typically be discarded. For a PCB having a tightly pitched array of terminals for connecting to a ball grid array, however, it may be extremely difficult to form a test connector that independently contacts each one of these terminals. It would, therefore, be highly desirable to have a tightly packed planar array of independently connectable electrical contact pads for the purpose of forming a test connector for a PCB bearing tightly packed arrays of electrical contact pad contacts or to convert the tightly pitched array of terminals to a less tightly packed array which can be tested by conventional means. In addition, a tightly packed planar array of electrical contact pads can also be used to test the ball grid array IC circuit itself.

One method used to construct planar arrays of independently connectable electrical contact pads is known as the "thin film\wet chemistry" process of building up a flex circuit layer by layer. Each dielectric layer is spin coated on to the top of the previously created laminate structure, then drilled or etched, plated and patterned. For via interconnects, a pad is first formed on a deposited layer for connection to the prospective next layer to be deposited. After the next layer is deposited a blind via is drilled to the underlying pad, followed by platting and patterning of a pad directly over the via, forming an electrical connection to the pad below. The disadvantages of this method are that it is expensive and a mistake on any layer can ruin the entire flex circuit.

Another traditional method to construct planar arrays of independently connectable electrical contact pads has been to join together conductively patterned dielectric layers each having mutually co-located connective pads. Individual patterned dielectric layers are first bonded together, typically through an intermediate dielectric, followed by via drilling and plating through the mutually co-located electrical contact pad pads to connect one layer to the next. Typically the connective paths are patterned to allow through hole drilling to connect layers. As additional layers are added they are drilled and plated to form connections. There are two principle problems associated with this method. First, many process steps are involved to drill and plate the various layers. Second, the accuracy required to align the various layers and successfully drill and plate to connect them severely limits the array density. If through hole drilling instead of blind vias are used to connect layers, the traces must be routed so as to avoid drilling through traces running above or below the layer to be connected, further limiting the array density.

Yet an additional method of constructing an array of contact pads interconnected through a multi-layer structure involves laminating patterned circuits together using anisotropic or z-axis adhesives which connect conductive portions of the individual layers together without forming a conductive short to neighboring traces. A disadvantage of this approach is the additional complexity involved in laying out the conductive circuit patterns as well as the higher cost and uncertain reliability of the anisotropic connective approach.

Although it theoretically might be desirable to adhere together a stack of layers bearing conductive paths to a top layer bearing an array of electrical contact pads and then drill and plate vias to connect each electrical contact pad to a target conductive path on an inner layer, a number of problems are presented in any attempt to implement such a method of construction. First, it is a challenge to drill through several layers without drilling through a conductor on a layer interposed between the drilling surface and the target conductive path. Second, some target conductive paths may be by necessity very thin, on the order of microns, presenting a challenge to one attempting to accurately drill a via to the target conductive path. Our invention addresses these limitations as described below.

SUMMARY OF THE INVENTION

The present invention is a method of constructing an electric apparatus, comprising the following steps. First, a set of dielectric layers is provided. Next, a set of conductive features and at least one fiducial marking are formed on a first one of the dielectric layers, in mutual reference to each other so that their relative positions are known to a first tolerance. Then, a set of pin holes is formed in each dielectric layer, each pin hole formed in relation to the fiducial marking for its dielectric layer and all of the sets of pin holes having a mutually identical placement. Finally the dielectric layers are arranged onto a pin fixture having a set of pins that match the mutually identical placement of the pin holes.

The foregoing and other objectives, features, and advantages of the invention will be more readily understood upon consideration of the following detailed description of the invention, taken in conjunction with the accompanying drawings.

DETAILED DESCRIPTION OF THE PREFERRED EMBODIMENT

Figure 1:
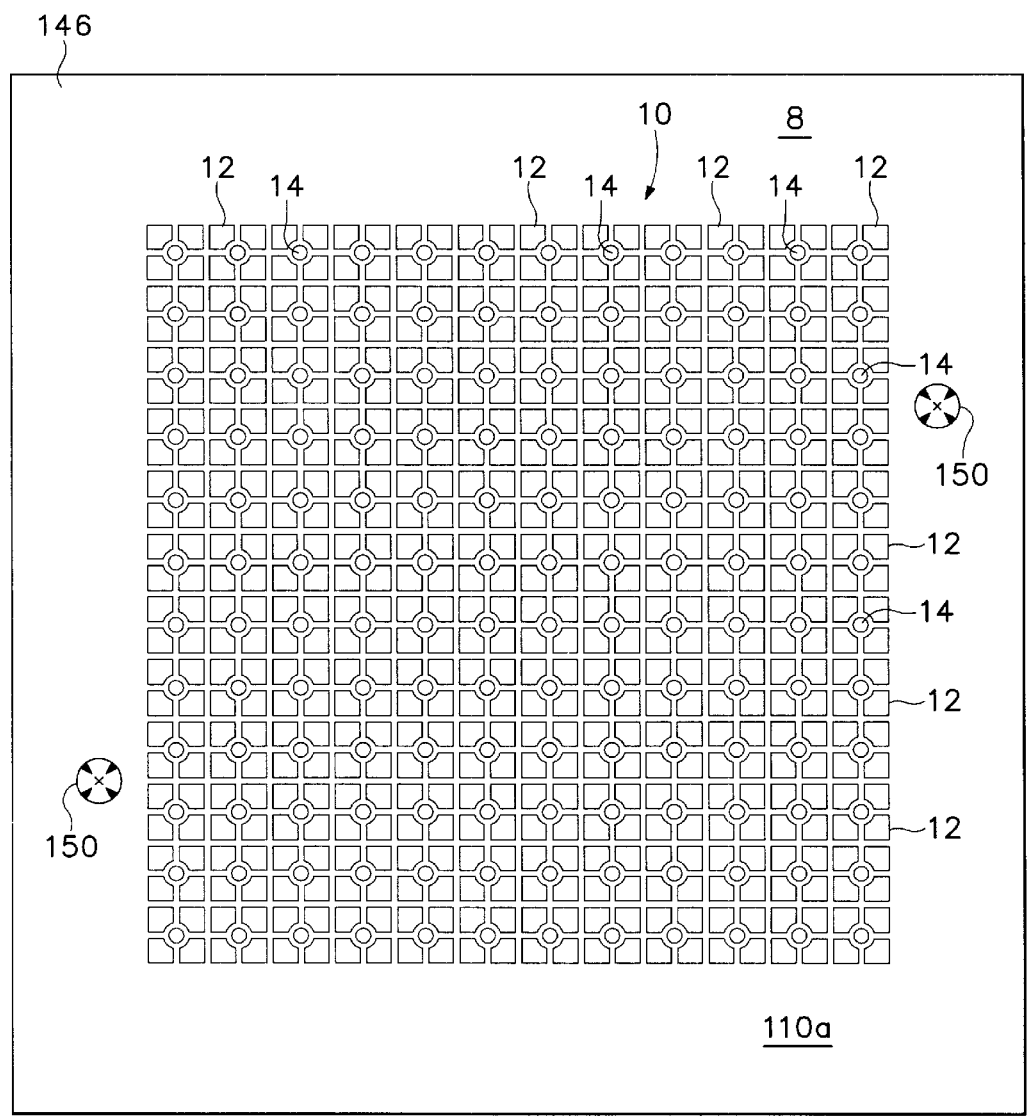
FIG. 1 is a greatly expanded plan view of a planar array of electrical contact pads born on the top surface of an electrical interconnecting device produced according to the present invention.
Figure 2:
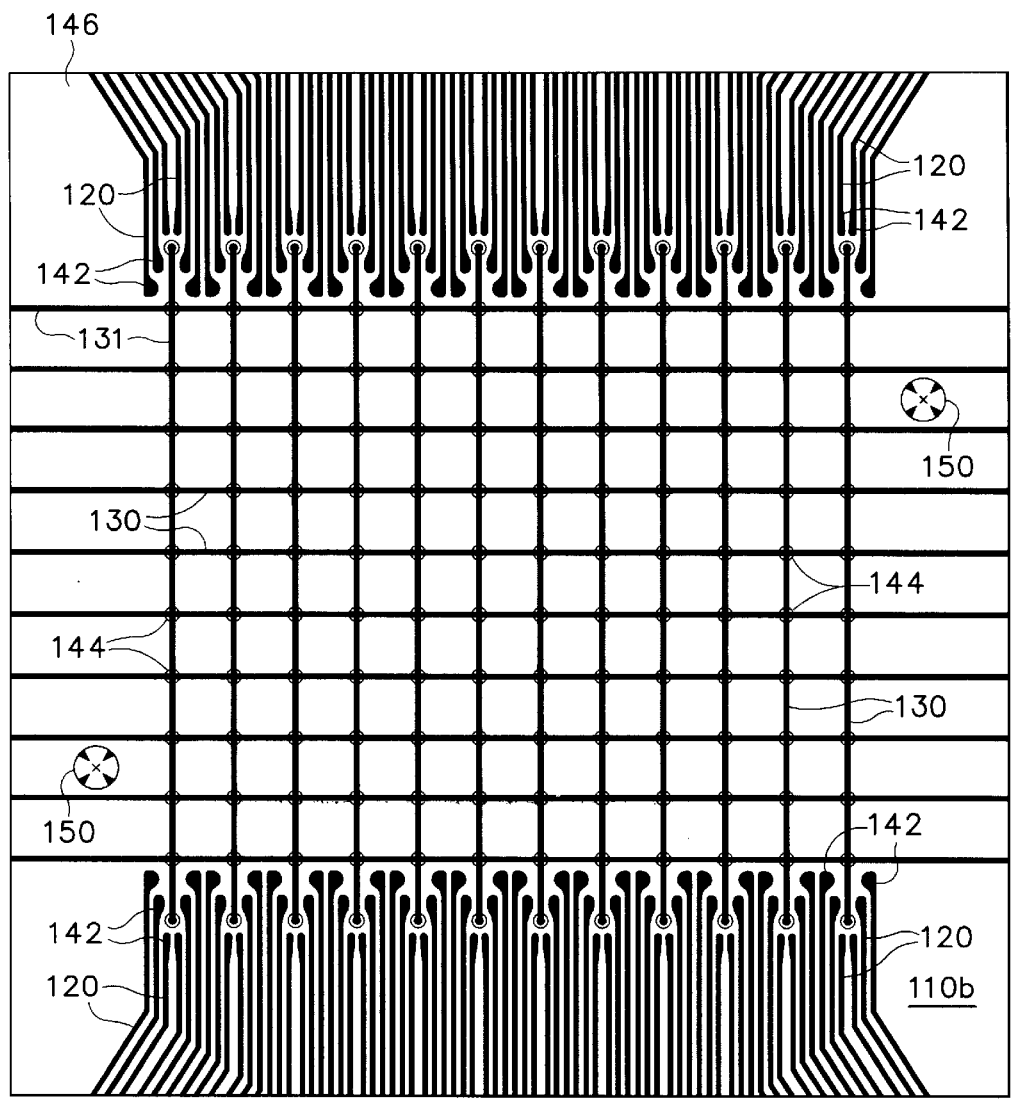
FIG. 2 is a greatly expanded plan view of a set of traces etched onto the bottom surface of the dielectric layer of FIG. 1.

Referring to FIG. 1, in a preferred embodiment, the method of the present invention produces an interconnecting device 8, such as a flex-circuit, having an array of active interconnect pads at electrical contact pad sites 12 and ground interconnect pads at sites 14. As noted in the Brief Description of the Drawings Section, FIG. 1 is greatly enlarged, with the actual total size of array 10 being on the order of a square centimeter and each active interconnect pad site 12 being on the order of 300 microns square. Each active interconnect pad must be individually and uniquely conductively connected to a pin on the outer edge of device 8 (not shown). The ground electrical contact pads should be all conductively connected together and also connected (with a maximum conductivity) to a pin or set of pins at the exterior of device 8. Noting the array dimensions, it is apparent that the problems involved in connecting all of the active interconnect pad sites 12 to pins at the exterior of device 8 without permitting appreciable cross-talk are considerable.

The preferred method begins with the etching, by photolithography, of a set of conductive features (when the term "conductive" is used in the detailed description portion of this application, the preferred material to be used is either copper or gold) on a set of dielectric (preferably polyimide) layers 110, 112, 114 and 116 each having two opposed surfaces of which top surface 110a and bottom surfaces, 110b, 112b, 114b, and 116b are shown in the drawings. Each layer surface 110a through 116b is etched to combine with the other layer surfaces 110a through 116b in a prospective stack 118 in a predetermined order according to preplanned distance from top surface 110a, which is to be etched as shown in FIG. 1.

Figure 4:
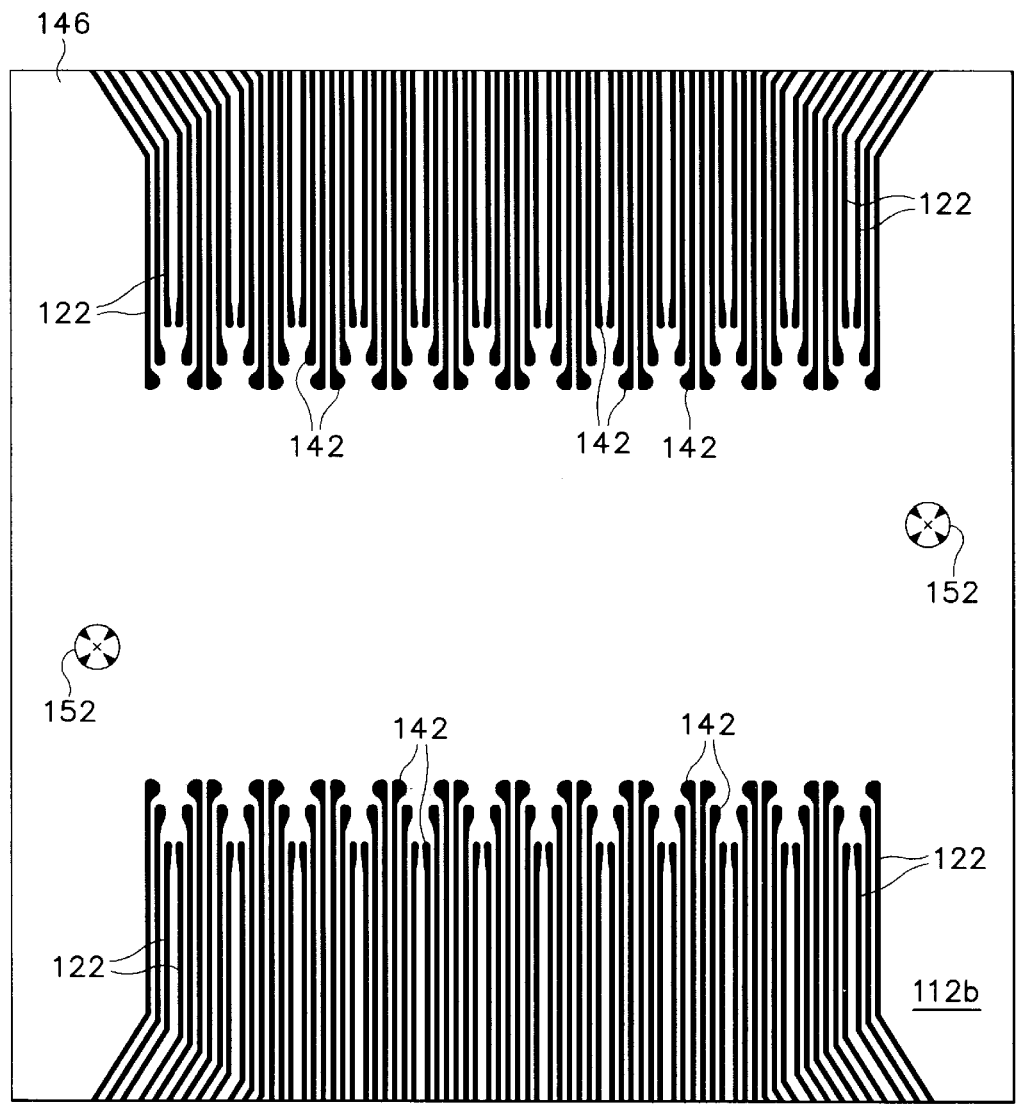
FIG. 4 is a greatly expanded plan view of the traces on the bottom of the second dielectric layer of the interconnecting device of FIG. 1.
Figure 5:
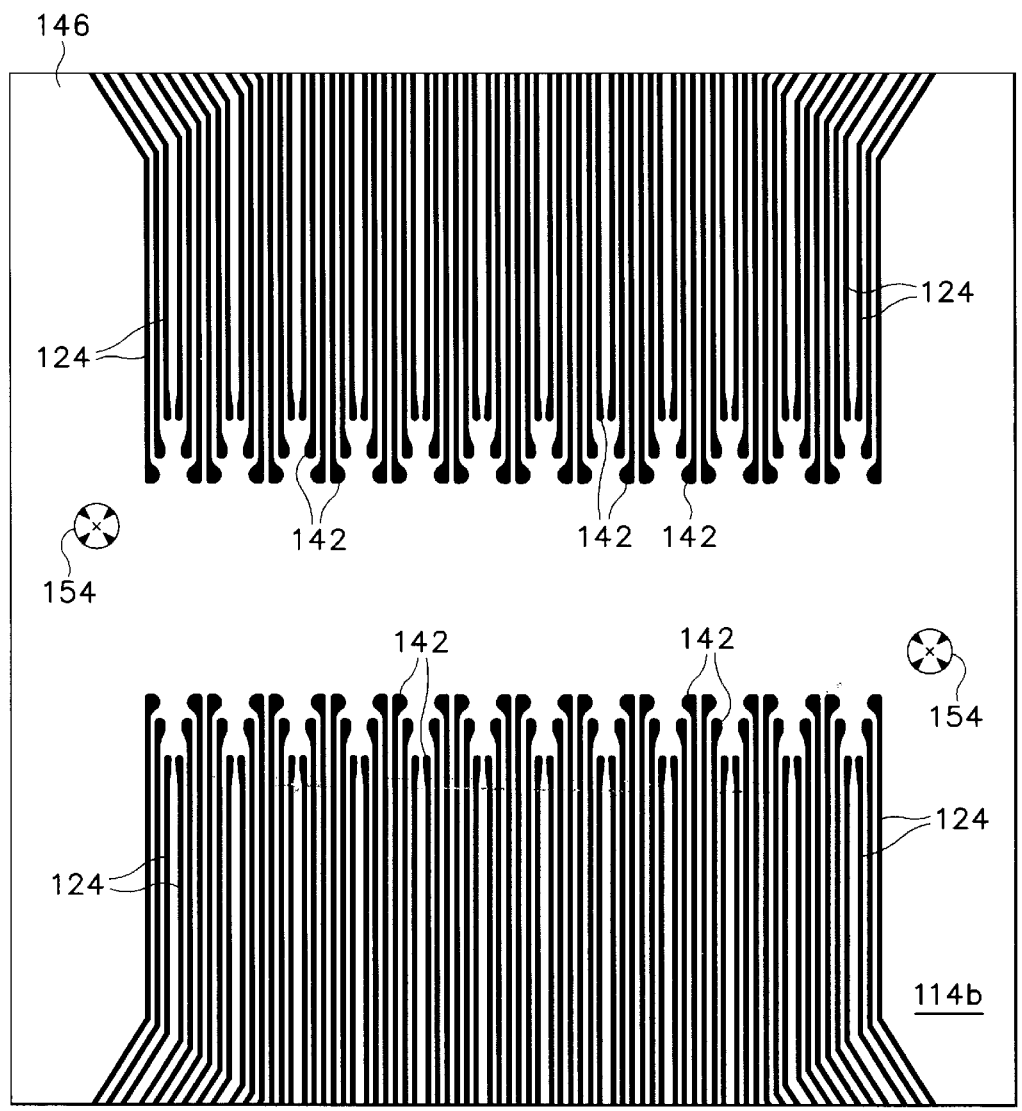
FIG. 5 is a greatly expanded plan view of the traces on the bottom of the third dielectric layer of the interconnecting device of FIG. 1.
Figure 6:
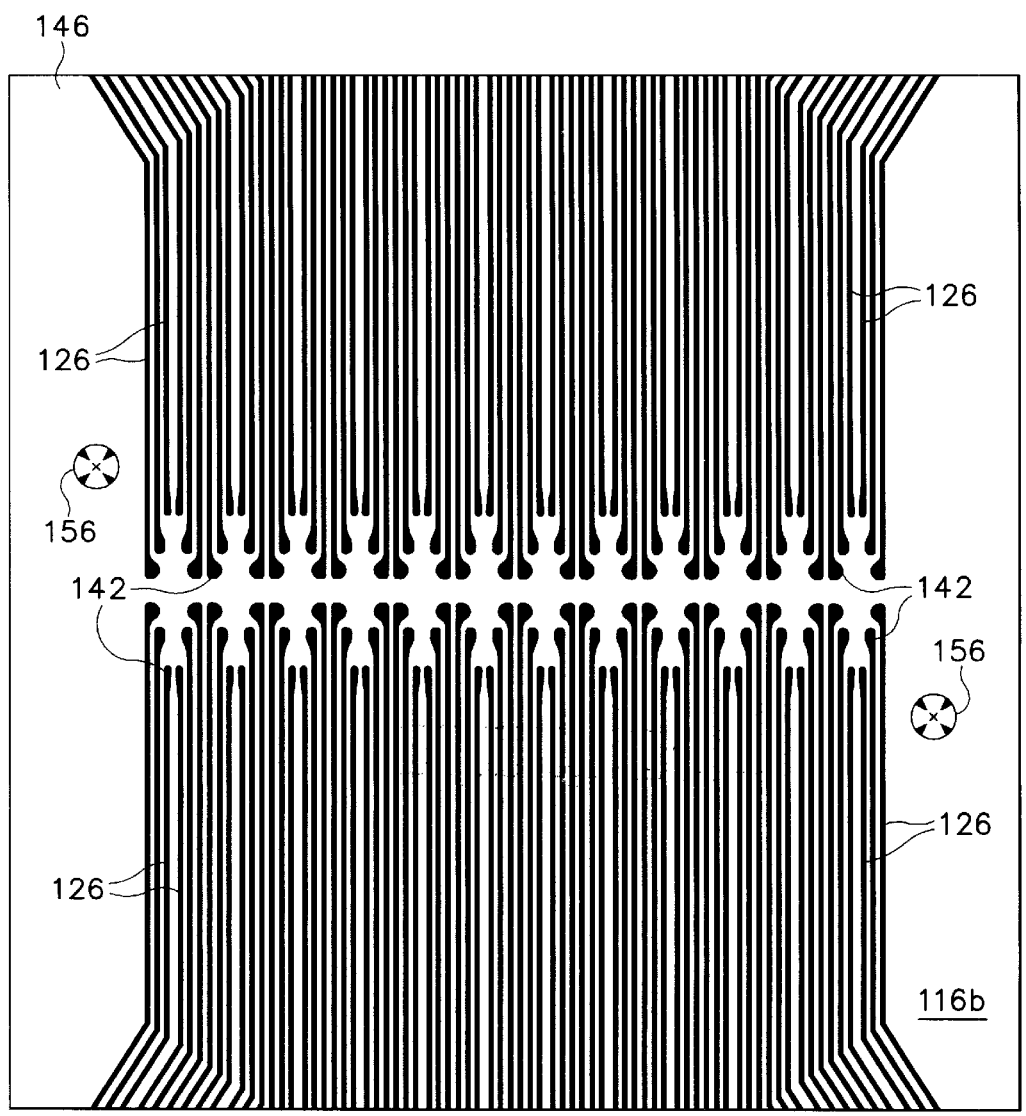
FIG. 6 is a greatly expanded plan view of the traces on the bottom of the forth dielectric layer of the interconnecting device of FIG. 1.

Referring to FIGS. 2 and 4–6, the bottom surface 110b is etched with a set of first conductive traces 120 which are arranged to connect some of the active electrical contact pad sites 12 to pins at the exterior of device 8 (not shown). These traces 120 define a first interior perimeter inside of which none of the traces 120 on surface 110b extend. A set of second conductive traces 122 are etched onto the bottom of surface 112b of the second layer 112 as shown in FIG. 4. These traces 122 all terminate inside the first interior perimeter defined by first traces 120 and, in turn, define a second interior perimeter inside of which none of the second traces 122 extend. In turn, a set of third conductive traces 124 are etched on surface 114b and extend beyond the second interior perimeter and define a third interior perimeter. Finally, a set of forth conductive traces 126 are etched onto surface 116b and extend beyond the third interior perimeter.

A set of ground traces 130 are etched onto surface 110b for attachment to ground 14. There is no need to keep the traces 14 separate and traces 14 are, indeed, all connected together as shown. In an alternative preferred embodiment, these traces are not needed and are not present. For example, in the case where device 8 is used for PCB testing, only active interconnect pads are needed, eliminating the need for ground traces 130.

Figure 3:
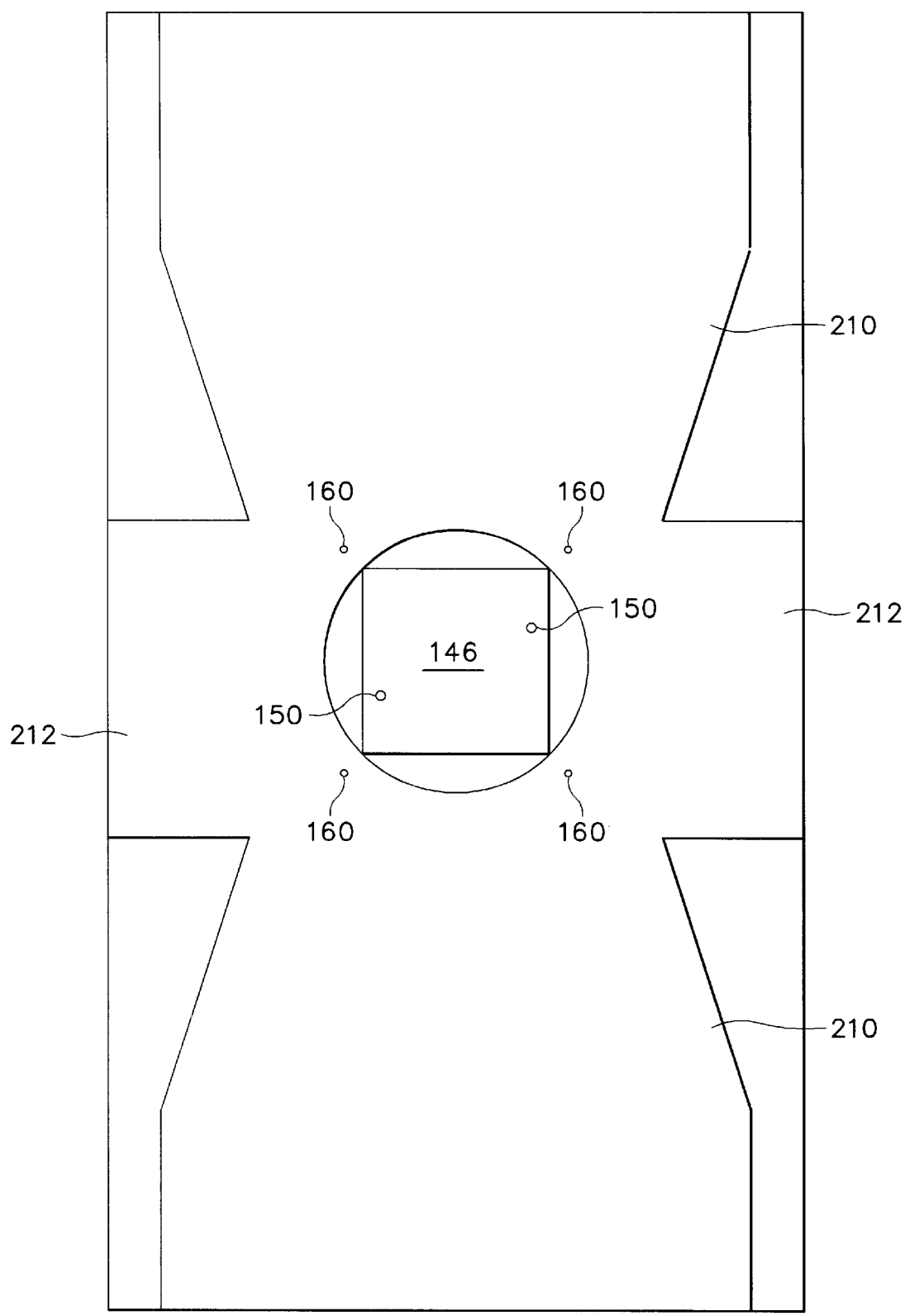
FIG. 3 is an expanded plan view of a copper plating pattern on the top of the second, third and forth dielectric layers of the planar array of electrical contact pads apparatus of FIG. 1.

Each of the interposed top surfaces of 112, 114 and 116 is etched with the pattern of conductive material shown in FIG. 3 (drawn to a much smaller scale than FIGS. 1, 2, 4, 5 and 6). A central region 146 that is bare of conductive material corresponds to the area shown in FIGS. 1, 2, 4, 5 and 6 for either the bottom surface of layers 112, 114 and 116 (FIGS. 4, 5 and 6) or the corresponding area on the top or bottom of the top layer 110 (FIG. 1). Conductive material plated onto this area on top surfaces of 112, 114, or 116 would interfere with subsequent drilling and interconnection of top surface pads 12 to bottom surfaces 112b, 114b and 116b, as will be described. The outlined areas represent conductive material plating that is preferably grounded, with a pair of main wings 210 extending outwardly to be interposed between the conductive traces 120, 122, 124 and 126 of different layers 110, 112, 114 and 116 as traces 120 extend from the central region 146 to the exterior pins of device 8. A pair of transverse wings 212 extend outwardly to shield ground traces 130 as they likewise extend from central region 146 to the exterior ground pins of device 8. In an alternative preferred embodiment, the layers represented by FIG. 3 are omitted.

During the etching process, at least one uniquely located fiducial marking 150, 152, 154 and 156 is produced by photolithography on each layer 110, 112, 114 and 116 respectively. Each marking 150, 152, 154 and 156 is produced using the same optical mask that produces the traces 120, 122, 124 and 126 respectively on layers 110, 112, 114 and 116 respectively, contemporaneously with the formation of the traces 120, 122, 124 and 126.

In each layer, 110, 112, 114 and 116, a set of pin holes 160 (FIG. 3) not shown for the top layer 110, but placed identically to pin holes 160 of layers 112, 114 and 116 (FIG. 3) are preferably laser drilled with reference to the fiducial markings 150, 152, 154 and 156 for the layer 110, 112, 114 and 116, respectively. Referencing with respect to fiducial markings 150, 152, 154 and 156 permits accuracy on the order of about 5 microns in the placement of the pin holes 160. After the etching of traces 120, 122, 124, 126 and 130 is complete, layers 110, 112, 114 and 116 are aligned by placing pin holes 160 in each layer 110, 112, 114 and 116 through a matching set of pins (not shown) on a fixture. Layers 110, 112, 114 and 116 are then adhered together by way of standard techniques into the aforementioned stack 118, having adhesive layers 136. Unfortunately, the alignment afforded by this method has an accuracy of about 10–15 microns due to a certain amount of excess clearance in placing pins through the pin holes 160, and from compression of dielectric layers 110, 112, 114 and 116 in the lamination process. This is a higher level of accuracy than was heretofore possible in this type of layer stacking, but not accurate enough to subsequently connect all layers without additional alignment means as will be described.

Figure 7:
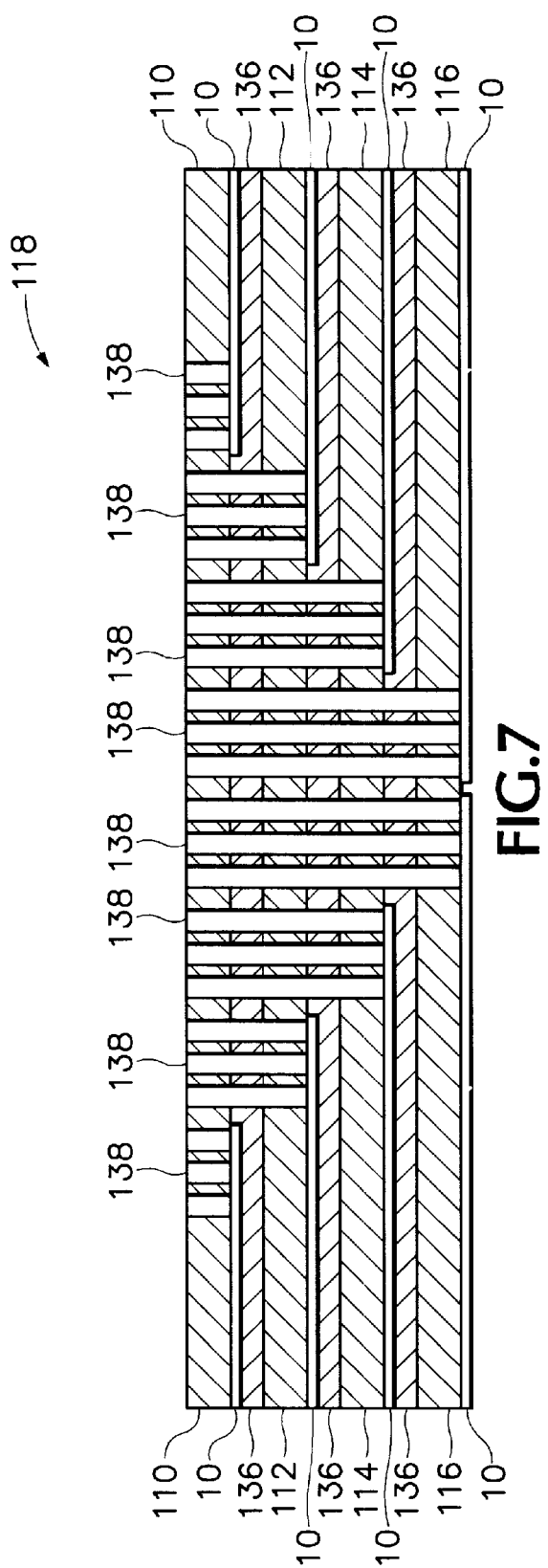
FIG. 7 is a greatly expanded cross-sectional view of the device of FIG. 1, taken along line 7—7 of FIG. 1.
Figure 8:
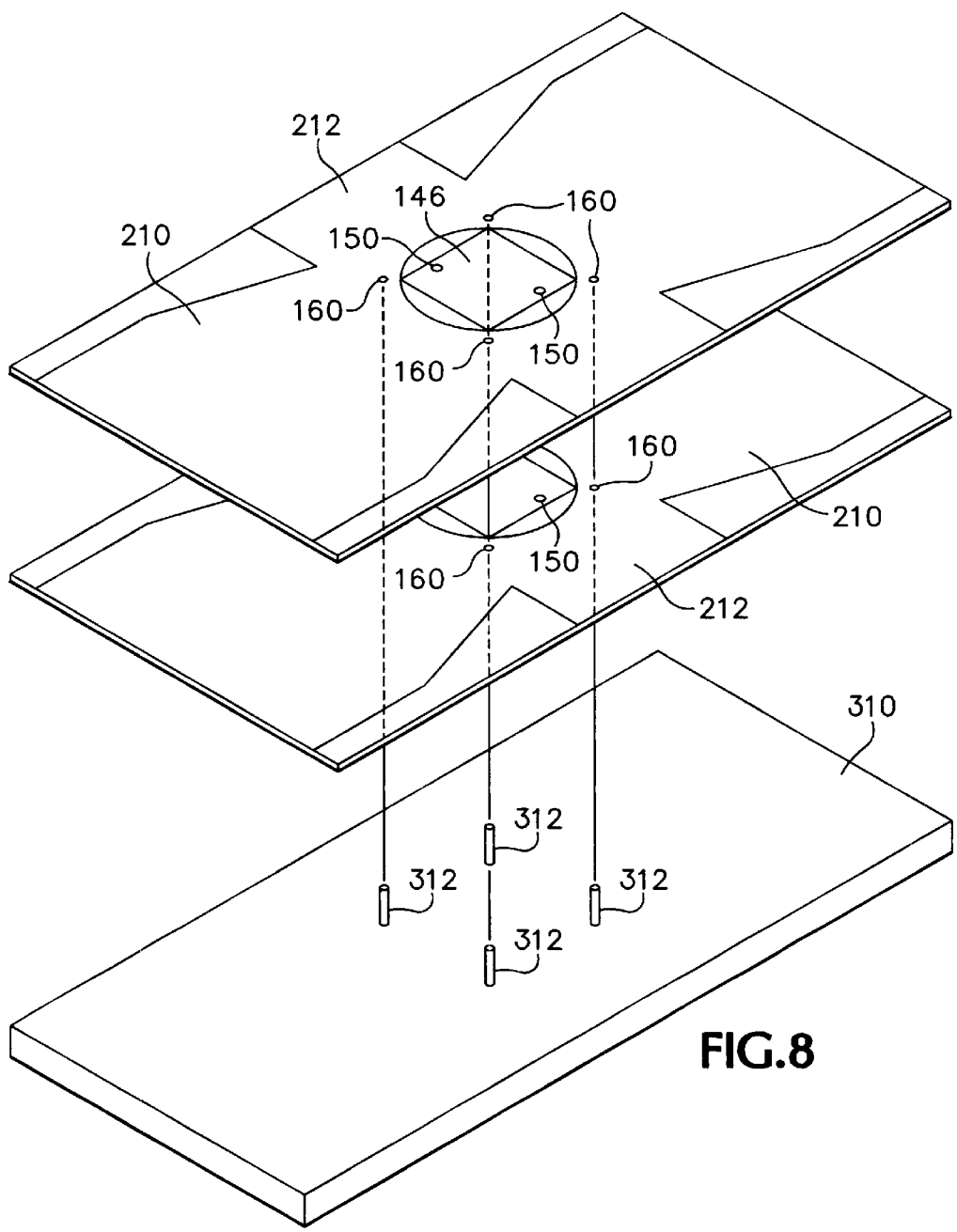
FIG. 8 shows a pair of layers being positioned on a fixture, according to the present invention.

As is visible in the drawings, each trace 120 ends in a slightly expanded-in-width trace terminus 142. To attach active interconnect pads 12 to traces 120, 122, 124 and 126 a via must be drilled through each active electrical contact pad site 12 to an underlying trace terminus 142. As is shown in FIG. 7, because of the arrangement of traces 120, there are no traces interposed between each trace terminus 142 and the overlying prospective electrical contact pad 12.

The figures are greatly expanded. In reality, trace termini 142 are each on the order 50 $\mu$m wide and a set of ground electrical contact pad targets 144 located at the intersections of traces 130 are no larger. Therefore, very precise drilling is required from each electrical contact pad site 12 of top surface 110a down to the corresponding target trace terminus 142 or ground target 144 for a plated via to be able to connect an electrical contact pad site 12 or 14 to the correct terminus 142 or target 144, respectively.

Because the fiducial markings 150, 152, 154 and 156 are offset from one another in the x-y dimensions of layers 110, 112, 114 and 116, and because layers 110–116 are transparent, each fiducial marking 150 is observable from the exterior of stack 118, enabling an operator to drill a set of vias 138 (see FIG. 7) in fixed relation to the fiducial markings for each layer 110, 112, 114 or 116 upon which the target trace terminus 142 exists. This represents an advancement over the prior art in which fiducial markings on different layers were typically not separately observable from a location outside of the device being constructed. If layers 110, 112, 114 and 116 were made of an opaque material an x-ray device could be used to render fiducial markings 150, 152, 154 and 156 observable. A nd:YAG frequency multiplied laser used with an accurate x-y laser/ work piece positioning system is an excellent tool for use in drilling a via to a specific depth at a specific location. As the laser and the stack may be moved very accurately with respect to each other, and because the fiducial markings are produced from the same optical mask as the traces, the laser drilling may be positioned accurately enough in relation to the target trace terminus 142 so that terminus 142 is reached and so that no other traces are connected to the via 138. Because of the comparatively large size of the active electrical contact pad sites 12 and ground electrical contact pad sites 14, it is practically a certainty that the electrical contact pad site 12 or 14 being connected to terminus 142 will completely overlay the target trace terminus 142 even allowing for up to 10–15 microns of inaccuracy in layer placement. The via 138 that contacts a trace terminus 142 will therefore also contact the desired corresponding electrical contact pad site 12.

After the drilling of vias 138, vias 138 are plated with a conductive material such as copper or gold. Additionally electrical contact pads at sites 12 and 14 are then constructed by standard photo lithographic and plating techniques. There is typically some overlap between the via 138 plating steps and the plating for producing electrical contact pads at sites 12 and 14.

By practicing the method of the present invention it is possible to quickly and efficiently build up a multi-layer electronic apparatus without drilling vias separately on each layer. Moreover, it is possible to build a connective device having a grid of closely spaced electrical contact pads that are separately routed to pins on the exterior of the connective device for translating from a pitch on the order of tens of microns to a pitch on the order of hundreds of microns or millimeters.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claim which follows.

What is claimed is:

1. A method of constructing a multilayer electric apparatus, comprising the steps of:

providing a set of dielectric layers;

forming a set of conductive features having positions and at least one fiducial marking having a position on each of said dielectric layers, wherein on each layer, said conductive features and said at least one fiducial marking are formed in mutual reference to each other so that said positions of said set of conductive features are known to a first tolerance relative to said position of said at least one fiducial marking;

forming a set of pin holes in each of said dielectric layers, each said set of pin holes formed in relation to said fiducial marking for said dielectric layer and all of said sets of pin holes mutually having a substantially identical placement;

providing a pin fixture having a set of pins that match said mutually identical placement of said pin holes; and arranging said dielectric layers on said pin fixture so that said set of pins extends through each of said sets of pin holes.

2. The method of claim 1, further including the step of forming at least one plated via to electrically connect a conductive feature on a first dielectric layer with a conductive feature on a second dielectric layer.

3. The method of claim 1, wherein after said step of arranging said dielectric layers on said pin fixture, one of said dielectric layers is on top of said stack and wherein said top dielectric layer includes a set of contact pads.

4. The method of claim 3 wherein each of said contact pads is electrically connected to a conductive feature on a dielectric layer that is not said top dielectric layer, by forming vias plated with conductive material.

5. The method of claim 4 wherein each said conductive feature is more specifically a conductive trace terminus, and wherein each conductive trace terminus is mutually electrically isolated from all of the other electrical trace termini, so that an interconnective device is formed having an array of electrical contact pads each connected to a different conductive trace.

6. The method of claim 5 wherein each conductive trace terminus is a first conductive trace terminus and wherein each conductive trace leads to a second conductive terminus that is adapted to be easily connected to some additional electrical circuitry.

* * * * *